United States Patent
Maalouf et al.

(10) Patent No.: US 10,608,595 B1
(45) Date of Patent: Mar. 31, 2020

(54) SYSTEMS AND METHODS FOR AUTOMATICALLY BIASING POWER AMPLIFIERS

(71) Applicant: NXP USA, Inc., Austin, TX (US)

(72) Inventors: Elie Maalouf, Mesa, AZ (US); Joseph Staudinger, Gilbert, AZ (US); Don Hayes, Scottsdale, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 16/139,761

(22) Filed: Sep. 24, 2018

(51) Int. Cl.
*H03F 3/04* (2006.01)
*H03F 1/02* (2006.01)
*H03F 1/30* (2006.01)

(52) U.S. Cl.
CPC ......... *H03F 1/0288* (2013.01); *H03F 1/0211* (2013.01); *H03F 1/301* (2013.01); *H03F 2200/18* (2013.01); *H03F 2200/366* (2013.01)

(58) Field of Classification Search
CPC ............................ H03F 3/04; H03F 2200/447
USPC ........................................ 330/285, 289, 296
See application file for complete search history.

(56) References Cited

U.S. PATENT DOCUMENTS

| | | | |
|---|---|---|---|
| 6,731,173 B1 | 5/2004 | Thompson | |
| 7,064,615 B2 | 6/2006 | Krvavac et al. | |
| 9,577,954 B2 | 2/2017 | Williams et al. | |
| 2003/0201827 A1 | 10/2003 | Ohnishi et al. | |
| 2004/0100327 A1 | 5/2004 | Krvavac | |
| 2004/0174213 A1 | 9/2004 | Thompson | |
| 2007/0111686 A1 | 5/2007 | Lee | |
| 2007/0194852 A1* | 8/2007 | Tsuromaki | H03F 1/302 330/285 |
| 2007/0247253 A1 | 10/2007 | Carey et al. | |

OTHER PUBLICATIONS

Ying Zhang, et al., "Bias circuit design of RF power amplifiers for TDD systems", 2011 International Conference on Electronics, Communications and Control (ICECC), pp. 2572-2575.
Seto, James; NXP (Freescale Semiconductor) Application Note AN1987—Quiescent Current Control for the RF Integrated Circuit Device Family, Rev 1; 8 pages (May 2004).
U.S. Appl. No. 16/139,761; 46 pages (filed Sep. 24, 2018).
Vigneri, Donna ; "Adaptive Gate Bias Module Ensures Amplifier Performance"; Microwave Journal MTT-S IMS Show Issue, vol. 59, Ed. 4; 9 pages (Apr. 15, 2016).

* cited by examiner

*Primary Examiner* — Steven J Mottola (57) ABSTRACT

Power amplifiers, amplifier systems, and related methods are disclosed herein. In one example embodiment, the amplifier system includes a bias controller that automatically sets a bias voltage of a power amplifier device by monitoring a reference device that is in a scaled relationship with the power amplifier device, and integrally is formed with the power amplifier device on a same semiconductor die. The bias controller can compare a voltage at an input to the reference device to a reference voltage, and then adjust a voltage at a control input of the reference device to a stabilized voltage that induces the reference device to drive the voltage at the input to the reference device equal to the reference voltage. Finally, the bias controller can transform, based on the scaled relationship, the stabilized voltage into a bias voltage applied to a control input of the power amplifier device.

24 Claims, 5 Drawing Sheets

SYSTEMS AND METHODS FOR AUTOMATICALLY BIASING POWER AMPLIFIERS

FIELD

Embodiments of the subject matter described herein relate generally to radio frequency (RF) amplifiers and related methods of operation.

BACKGROUND

Wireless communication systems employ power amplifiers for increasing the power of radio frequency (RF) signals. In a wireless communication system, a power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range. The high efficiency of the Doherty architecture makes the architecture desirable for current and next-generation wireless systems. However, current amplifier designs can have a wide window of threshold voltages that result from normal manufacturing process variations. The wide window of threshold voltages can result in significant changes to part to part linearity and performance efficiency.

In view of the above, there is a need for improved amplifiers and related methods of operation that address one or more of the above concerns, or other concerns, associated with conventional amplifiers, and/or provide one or more advantages by comparison with conventional amplifiers.

DETAILED DESCRIPTION

A typical two-way Doherty amplifier implementation includes a carrier amplifier and a peaking amplifier that provide separate paths configured to amplify carrier and peaking signals, respectively. In a Doherty amplifier, the input radio frequency (RF) signal applied to respective power transistors of the carrier amplifier and the peaking amplifier are biased with a direct current (DC) voltage to set the operating mode of each transistor. However, manufacturing and temperature variations for each of the transistor dies can produce a wide window of possible threshold voltages, which can in turn lead to significant changes in part to part (die to die) linearity, make providing a suitable biasing voltage problematic, and reduce performance efficiency. Embodiments encompassed by the present disclosure include embodiments that combine a bias controller with Doherty amplifiers having reference devices integrated into the power transistor die, where the bias controller is configured to dynamically apply the suitable biasing voltages to one or more carrier amplifier transistors and to one or more peaking amplifier transistors. One or more of the embodiments described herein serve to eliminate or reduce part to part bias variations that can occur due to the aforementioned wide window of threshold voltages over process, and also can track and maintain current bias density so as to reduce or minimize performance variations over temperature. This in effect can eliminate or reduce the extensive and cumbersome bias calibration routines that are typically done by end users to account for variations in relation to conventional modules. Reducing bias variations resulting from process and temperature differences can help maintain tight efficiency and linearity in mMIMO (massive multiple-input, multiple-output) systems that include Doherty amplifiers and can remove the need to calibrate bias levels at the time of construction.

Figure 1:
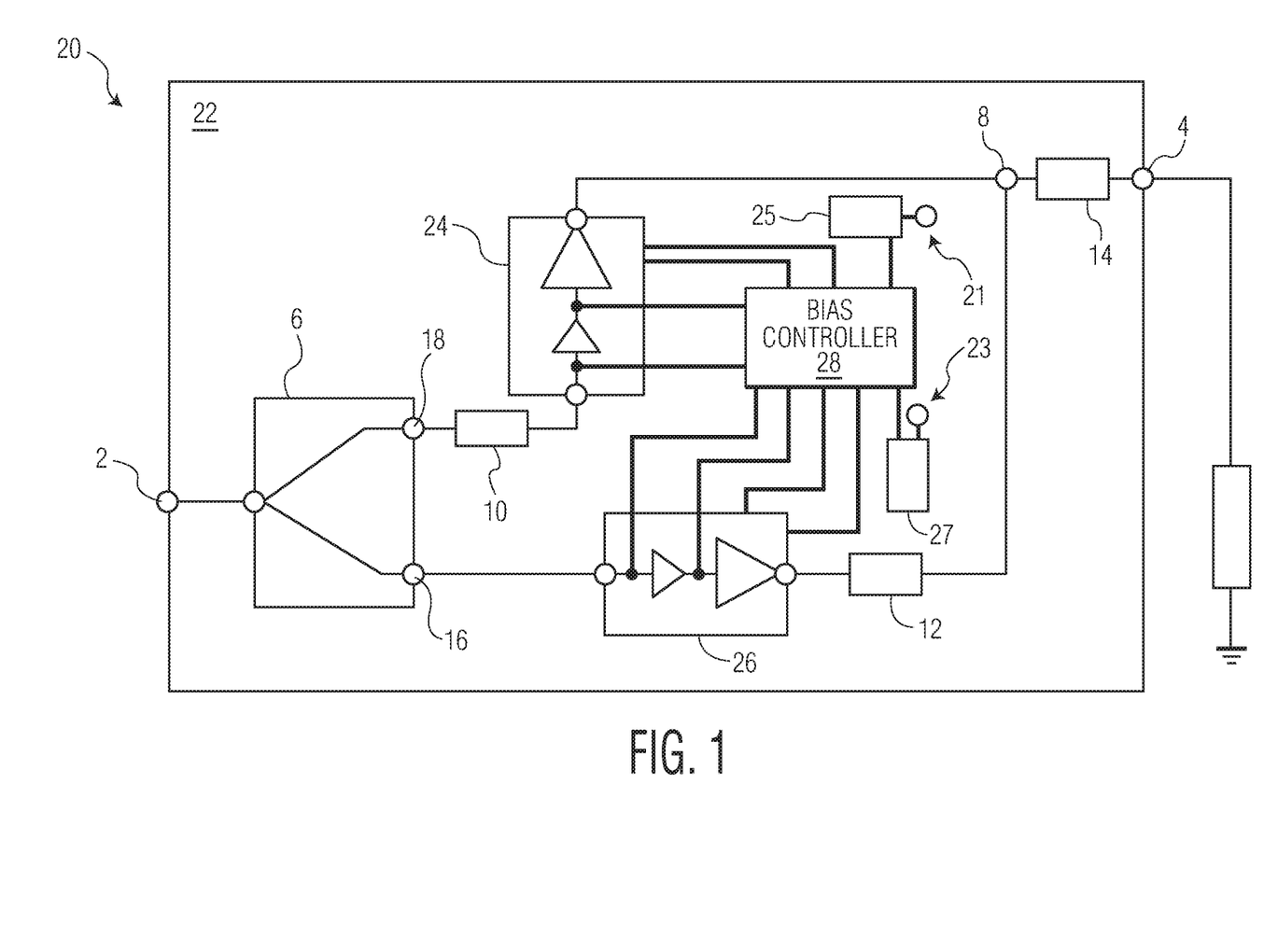
FIG. 1 is a schematic diagram of a Doherty amplifier system, in accordance with an example embodiment.

FIG. 1 is a schematic diagram of a Doherty amplifier system 20, in accordance with an example embodiment. As indicated in FIG. 1, some or all components of the Doherty amplifier system 20 may be implemented in a single device package or module 22. As will be explained in detail later, and in accordance with various embodiments, the Doherty amplifier system 20 includes a dual stage peaking amplifier 24, a first high tolerance drain resistor 25, a dual stage carrier amplifier 26, a second high tolerance drain resistor 27 and a bias controller or bias voltage generator 28. The bias controller 28 is electrically coupled to both the dual stage peaking amplifier 24 and the dual stage carrier amplifier 26 with eight distinct connections. The first high tolerance drain resistor 25 is electrically coupled between a DC voltage source 21 and the bias controller 28, and the second high tolerance drain resistor 27 is electrically coupled between a DC voltage source 23 and the bias controller 28. Multiple voltage values are contemplated for the DC voltage sources 21 and 23, including, but not limited to, 3.3 volts and 5 volts with a tolerance of +1-5%. In some embodiments, the DC voltage sources 21 and 23 can be equivalent.

Additionally as shown, the Doherty amplifier system 20 also includes an RF input node 2, an RF output node 4, a power splitter 6, a combining node 8, and first, second, and third phase shift/impedance inversion/matching components 10, 12, and 14, respectively. The dual stage peaking amplifier 24 and dual stage carrier amplifier 26 are coupled in parallel between the power splitter 6 and combining node 8. The dual stage carrier amplifier 26 particularly is coupled between the combining node 8 and a first output port 16 of the power splitter 6, with the second phase shift/impedance inversion/matching component 12 being coupled between that amplifier and the combining node 8. The dual stage peaking amplifier 24 particularly is coupled between a second output port 18 of the power splitter 6 and the combining node 8, with the first phase shift/impedance inversion/matching component 10 being coupled between the second output port 18 and that amplifier. The combining node 8 is in turn coupled to the RF output node 4 by way of the third phase shift/impedance inversion/matching component 14 coupled therebetween.

Figure 2:
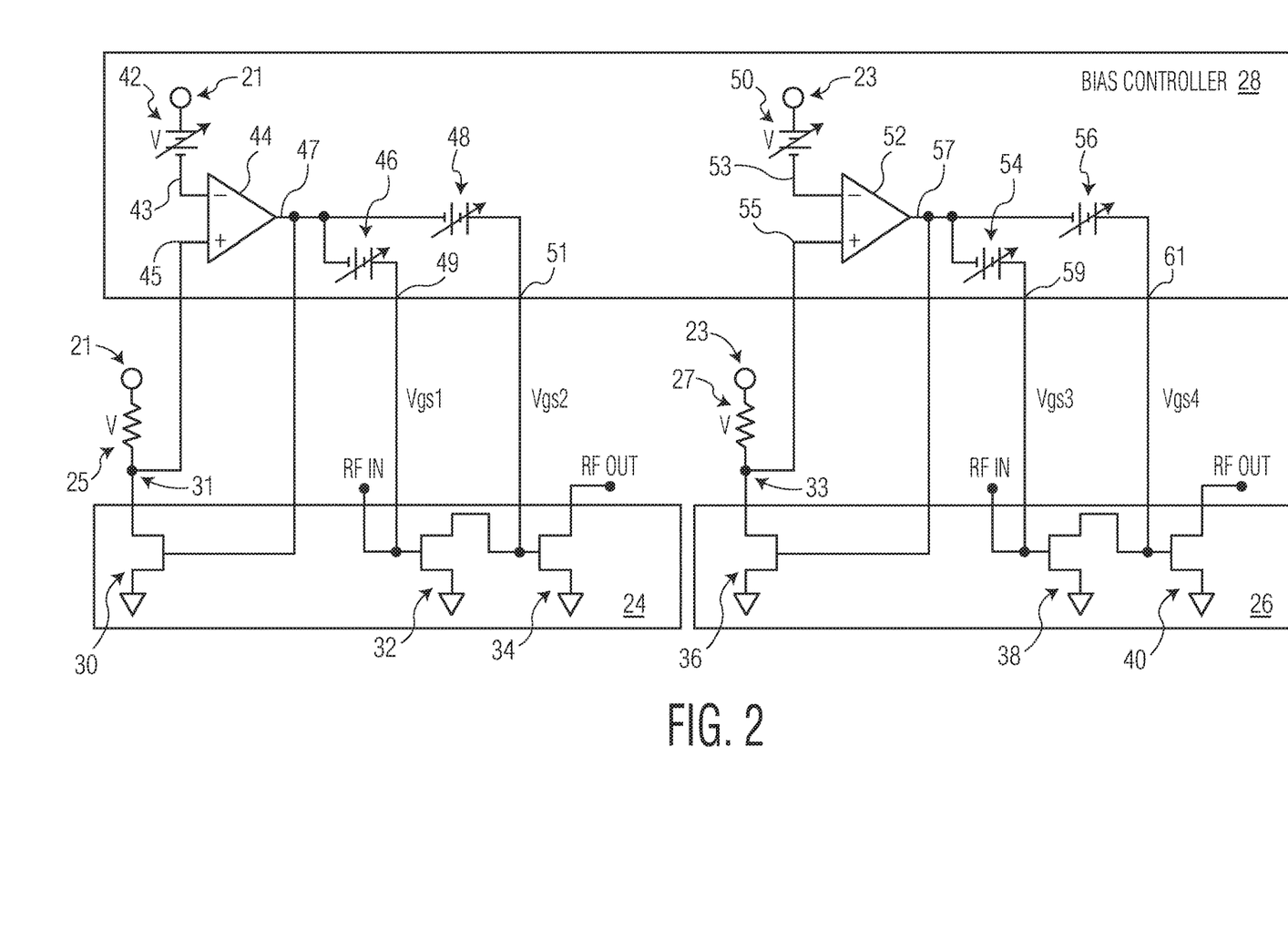
FIG. 2 is a schematic diagram representing the interconnections between a bias controller, a carrier device, and a peaking device as can be employed in the Doherty amplifier system of FIG. 1, in accordance with an example embodiment.

FIG. 2 is a schematic diagram showing the internal components of and interconnections between the dual stage peaking amplifier 24, the first high tolerance drain resistor 25, the dual stage carrier amplifier 26, the second high tolerance drain resistor 27, and the bias controller 28, in accordance with an example embodiment. As indicated in FIG. 2, the dual stage peaking amplifier 24 can include a first reference device 30, a first power amplifier (PA) device 32, and a second PA device 34, and the dual stage carrier amplifier 26 can include a second reference device 36, a third PA device 38, and a fourth PA device 40.

The first reference device 30 can be integrally formed on a single integrated circuit die with the first PA device 32 and the second PA device 34 so that the first reference device 30 will match the first PA device 32 and the second PA device 34 in terms of part to part (die to die) process and temperature variations. In some configurations, the first reference device 30 is in a first scaled relationship with the first PA device 32 and a second scaled relationship with the second PA device 34. For example, the first reference device 30 and the first PA device 32 may be sized to have a ratio between about 1:3 and about 1:10, and the first reference device 30 and the second PA device 34 may be sized to have a ratio between about 1:20 and about 1:50, although the ratios could be higher or lower, as well. The second reference device 36 can be integrally formed on a single integrated circuit die with the third PA device 38 and the fourth PA device 40 so that the second reference device 36 will match the third PA device 38 and the fourth PA device 40 in terms of part to part (die to die) process and temperature variations. In some configurations, the second reference device 36 is in a third scaled relationship with the third PA device 38 and a fourth scaled relationship with the fourth PA device 40. For example, the second reference device 36 and the third PA device 38 may be sized to have a ratio between about 1:3 and about 1:10, and the second reference device 36 and the fourth PA device 40 may be sized to have a ratio between about 1:30 and about 1:75, although the ratios could be higher or lower, as well. In some configurations, each of the first reference device 30, the first PA device 32, the second PA device 34, the second reference device 36, the third PA device 38, and the fourth PA device 40 can include a respective power transistor having a respective control input or terminal (e.g., a gate terminal) and respective first and second current-carrying terminals (e.g., a drain terminal and a source terminal).

Further as shown in FIG. 2, the bias controller 28 can include a first programmable voltage source 42, a first comparator circuit 44, a first programmable digital to analog converter (DAC) 46, a second programmable DAC 48, a second programmable voltage source 50, a second comparator circuit 52, a third programmable DAC 54, and a fourth programmable DAC 56. In some embodiments, the first, second, third, and fourth programmable DACs 46, 48, 50, and 52 can be omitted. In some configurations, the first high tolerance drain resistor 25 is electrically coupled between the DC voltage source 21 and a current-carrying terminal (e.g., the drain) of the first reference device 30, and the second high tolerance drain resistor 27 is electrically coupled between a DC voltage source 23 and a current-carrying terminal (e.g., the drain) of the second reference device 36. In some embodiments, the first high tolerance drain resistor 25 and the second high tolerance drain resistor 27 may be coupled to the respective drains of the first and second reference devices 30 and 36 through a connection to the bias controller 28 as shown in FIG. 1.

A first (e.g., inverting) input 43 of the first comparator circuit 44 is electrically coupled to an output of the first programmable voltage source 42, a second (e.g., non-inverting) input 45 of the first comparator circuit 44 is electrically coupled to a current-carrying terminal (e.g., the drain) of the first reference device 30, and an output 47 of the first comparator circuit 44 is electrically coupled to the control input (e.g., the gate) of the first reference device 30 and respective inputs of each of the first and second programmable DACs 46 and 48. An output 49 of the first programmable DAC 46 is electrically coupled to the control input (e.g., the gate) of the first PA device 32, and an output 51 of the second programmable DAC 48 is electrically coupled to the control input (e.g., the gate) of the second PA device 34.

In RF PA die 24, the first and second PA devices 32, 34 are connected in a cascaded arrangement between the RF input (RF IN) and the RF output (RF OUT). More particularly, and as shown, the control terminal (e.g., the gate) of the first PA device 32 is electrically coupled to RF IN (e.g., to output 18 of power splitter 6, FIG. 1), and one current-carrying terminal (e.g., the drain) of the first PA device 32 is electrically coupled to the control input (e.g., the gate) of the second PA device 34. A current-carrying terminal (e.g., the drain) of the second PA device 34 is electrically coupled to RF OUT (e.g., to the combining node 8, FIG. 1). The second current-carrying terminals (e.g., the sources) of the first and second PA devices 32, 34 may be electrically connected to a ground reference. In this regard, it should be appreciated that, in the context of the embodiment of FIG. 2 (and FIG. 1) in which the Doherty amplifier system 20 employs the dual stage peaking amplifier 24 that includes the first and second PA devices 32 and 34, the control input of the first PA device 32 is the node at which a RF input signal is received by the cascaded arrangement of PA devices for amplification by those devices. Additionally, the drain of the second PA device 34 is the node at which an RF output signal is output by the cascaded arrangement of PA devices, with the RF output signal being an amplified version of the RF input signal after being amplified by those PA devices.

Also, a first (e.g., inverting) input 53 of the second comparator circuit 52 is electrically coupled to an output of the second programmable voltage source 50, a second (e.g., non-inverting) input 55 of the second comparator circuit 52 is electrically coupled to a current-carrying terminal (e.g., the drain) of the second reference device 36, and an output 57 of the second comparator circuit 52 is electrically coupled to the control input (e.g., the gate) of the second reference device 36 and respective inputs of each of the third and fourth programmable DACs 54 and 56. An output 59 of the third programmable DAC 54 is electrically coupled to the control input (e.g., the gate) of the third PA device 38, and an output 61 of the fourth programmable DAC 56 is electrically coupled to the control input (e.g., the gate) of the fourth PA device 40.

In RF PA die 26, the third and fourth PA devices 38, 40 are connected in a cascaded arrangement between the RF input (RF IN) and the RF output (RF OUT). More particularly, and as shown, the control terminal (e.g., the gate) of the third PA device 38 is electrically coupled to RF IN (e.g., to output 16 of power splitter 6, FIG. 1), and one current-carrying terminal (e.g., the drain) of the third PA device 38 is electrically coupled to the control input (e.g., the gate) of the fourth PA device 40. A current-carrying terminal (e.g., the drain) of the fourth PA device 40 is electrically coupled to RF OUT (e.g., to the combining node 8, FIG. 1). The second current-carrying terminals (e.g., the sources) of the third and fourth PA devices 38, 40 may be electrically connected to a ground reference. In this regard, it should be appreciated that, in the context of the embodiment of FIG. 2 (and FIG. 1) in which the Doherty amplifier system 20 employs the dual stage carrier amplifier 26 that includes the third and fourth PA devices 38 and 40, the control input of the third PA device 38 is the node at which a RF input signal is received by the cascaded arrangement of PA devices for amplification by those devices. Additionally, the drain of the fourth PA device 40 is the node at which an RF output signal is output by the cascaded arrangement of PA devices, with the RF output signal being an amplified version of the RF input signal after being amplified by those PA devices.

The components coupled to the peaking amplifier 24 operate as follows. The first programmable voltage source 42 is configured to provide a first reference voltage at the input 43 of the first comparator circuit 44. In some embodiments, the first reference voltage is set to a value representing a desired voltage drop from the DC voltage source 21 across the first high tolerance drain resistor 25 that is indicative of a desired constant current flow amount through both the first high tolerance drain resistor 25 and a conductive channel (e.g., drain-to-source channel) of the first reference device 30. In some embodiments, the first reference voltage provided to the input 43 of the first comparator circuit 44 is approximately 2.8 volts, although the first reference voltage could be higher or lower, as well. The first comparator circuit 44 compares the first reference voltage to the voltage at a node 31 (e.g. the voltage drop across the first high tolerance drain resistor 25) and adjusts an output voltage at the output 47 to attain a first stabilized voltage, which is provided to the control terminal (e.g., gate) of the first reference device 30. The first stabilized voltage induces the first reference device 30, via the control input of the first reference device 30, to drive the voltage drop across the first high tolerance drain resistor 25 to equal the first reference voltage. In some embodiments, the first stabilized voltage is approximately 2 volts, although the first stabilized voltage could be higher or lower, as well. Once the first comparator circuit 44 produces the first stabilized voltage, the first programmable DAC 46 is configured to offset the first stabilized voltage by a first offset voltage to produce a first control voltage applied to the control input of the first PA device 32. In some embodiments, the first offset voltage can be approximately 0.1 volts, although the first offset voltage could be higher or lower. In some embodiments, the first control voltage is approximately 1.9 volts, although the first control voltage could be higher or lower, as well. Likewise, the second programmable DAC 48 is configured to offset the first stabilized voltage by a second offset voltage to produce a second control voltage applied to the control input of the second PA device 34. In some embodiments, the second offset voltage can be approximately 0.9 volts, although the second offset voltage could be higher or lower. In some embodiments, the second control voltage is approximately 1.3 volts, although the second control voltage could be higher or lower, as well.

The first programmable DAC 46 and the second programmable DAC 48 offset the first stabilized voltage to drive the first and second PA devices 32 and 34 to operate in a class C mode. For example, the first offset voltage and the third offset voltage can be preconfigured by adjusting control inputs of the first and second programmable DACs 46 and 48 to drive the first and second PA devices 32 and 34 to operate in the class C mode.

In some embodiments, the Doherty amplifier system 20 may form a portion of a transmit chain in a transceiver that supports both transmit and receive states. The first programmable DAC 46 and the second programmable DAC 48 are configured to apply the first and second control voltages to the respective control inputs of the first PA device 32 and the second PA device 34 when the transceiver is in a transmit state. The first control voltage provides a first bias (e.g., DC bias) voltage for a first RF signal applied to the control input of the first PA device 32 (labeled "RF IN") and the second control voltage provides a second bias (e.g., DC bias) voltage for a second RF signal applied to the control input of the second PA device 34. In the present dual amplifier configuration, the second RF signal is the output signal from the drain of the first PA device 32. The first and second bias voltages increase the DC voltage level(s) (DC component (s)) of the first and second RF signals, respectively, to level(s) that will induce the first and second PA devices 32 and 34 to operate in their respective "active" (or "linear") regions. When operating in these active regions, the first and second PA devices 32, 34 operate to amplify the respective RF signals applied to the respective control inputs of the first and second PA devices 32 and 34. In some embodiments, the first and second bias voltages can bias the first and second PA devices 32, 34 to operate in class C mode, or in class AB mode.

The components coupled to the carrier amplifier 26 operate in a substantially similar manner to the components coupled to the peaking amplifier 24 discussed above. In particular, the second programmable voltage source 50 is configured to provide a second reference voltage at the input 53 of the second comparator circuit 52. In some embodiments, the second reference voltage is set to a value representing a desired voltage drop from the DC voltage source 23 across the second high tolerance drain resistor 27 that is indicative of a desired constant current flow amount through both the second high tolerance drain resistor 27 and a conductive channel (e.g., drain-to-source channel) of the second reference device 36. In some embodiments, the second reference voltage provided to input 53 of the second comparator circuit 52 is approximately 2.8 volts, although the second reference voltage could be higher or lower, as well. In some embodiments, the second programmable voltage source 50 is the same component as the first programmable voltage source 42. In such embodiments, the second reference voltage will be equivalent to the first reference voltage. In other embodiments, voltage sources 42, 50 could be distinct components, in which case the first and second reference voltages could be equivalent or different from each other.

The second comparator circuit 52 compares the second reference voltage to the voltage at a node 33 (e.g., the voltage drop across the second high tolerance drain resistor 27), and adjusts an output voltage at the output 57 to attain a second stabilized voltage, which is provided to the control terminal (e.g., gate) of the second reference device 36. The second stabilized voltage induces the second reference device 36, via the control input of the second reference device 36, to drive the voltage drop across the second high tolerance drain resistor 27 to equal the second reference voltage. In some embodiments, the second stabilized voltage is approximately 2 volts, although the second stabilized voltage could be higher or lower, as well. After the second comparator circuit 52 produces the second stabilized voltage, the third programmable DAC 54 is configured to offset the second stabilized voltage by a third offset voltage to produce a third control voltage applied to the control input of the third PA device 38. In some embodiments, the third offset voltage can be approximately 0.1 volts, although the third offset voltage could be higher or lower. In some embodiments, the third control voltage is approximately 1.9 volts, although the third control voltage could be higher or lower, as well. Likewise, the fourth programmable DAC 56 is configured to offset the second stabilized voltage by a fourth offset voltage to provide a fourth control voltage applied to the control input of the fourth PA device 24. In some embodiments, the fourth offset voltage can be approximately 0.1 volts, although the fourth offset voltage could be higher or lower. In some embodiments, the fourth control voltage is approximately 1.8 volts, although the fourth control voltage could be higher or lower, as well. The third programmable DAC 54 and the fourth programmable DAC 56 offset the second stabilized voltage to drive the third and fourth PA devices 36 and 38 to operate in a class AB mode. For example, the first offset voltage and the third offset voltage can be preconfigured by adjusting control inputs of the first and second programmable DACs 56 and 54 to drive the third and fourth PA devices 36 and 38 to operate in the class AB mode.

In some embodiments, the third programmable DAC 54 and the fourth programmable DAC 56 are configured to apply the third and fourth control voltages to the respective control inputs of the third PA device 38 and the fourth PA device 40 when the transceiver is in the transmit sate. The third control voltage provides a third bias (e.g., DC bias) voltage for a third RF signal applied to the control input (labeled "RF IN") of the third PA device 38 and the fourth control voltage provides a fourth bias (e.g., DC bias) voltage for a fourth RF signal applied to the control input of the fourth PA device 40. In the present dual amplifier configuration, the fourth RF signal is the output signal from the drain of the third PA device 38. The third and fourth bias voltages increase the DC voltage level(s) (DC component (s)) of the third and fourth RF signals, respectively, to level(s) that will induce the third and fourth PA devices 38 and 40 to operate in their respective "active" (or "linear" regions). When operating in these active regions, the third and fourth PA devices 38, 40 operate to amplify the respective RF signals applied to the respective control inputs of the third and fourth PA devices 38 and 40. In some embodiments, the third and fourth bias voltages can bias the third and fourth PA devices 38, 40 to operate in class AB mode, or in class C mode.

It should be noted that while the above description describes the bias controller 28 operating as part of a Doherty amplifier system 20 including multiple dual stage power amplifier devices (e.g., the dual stage peaking amplifier 24 and the dual stage carrier amplifier 26), various other embodiments are contemplated. These embodiments include but are not limited to embodiments employing a bias controller similar to the bias controller 28 that operates with respect to either a single one stage power amplifier device or a single dual stage power amplifier device.

Figure 3:
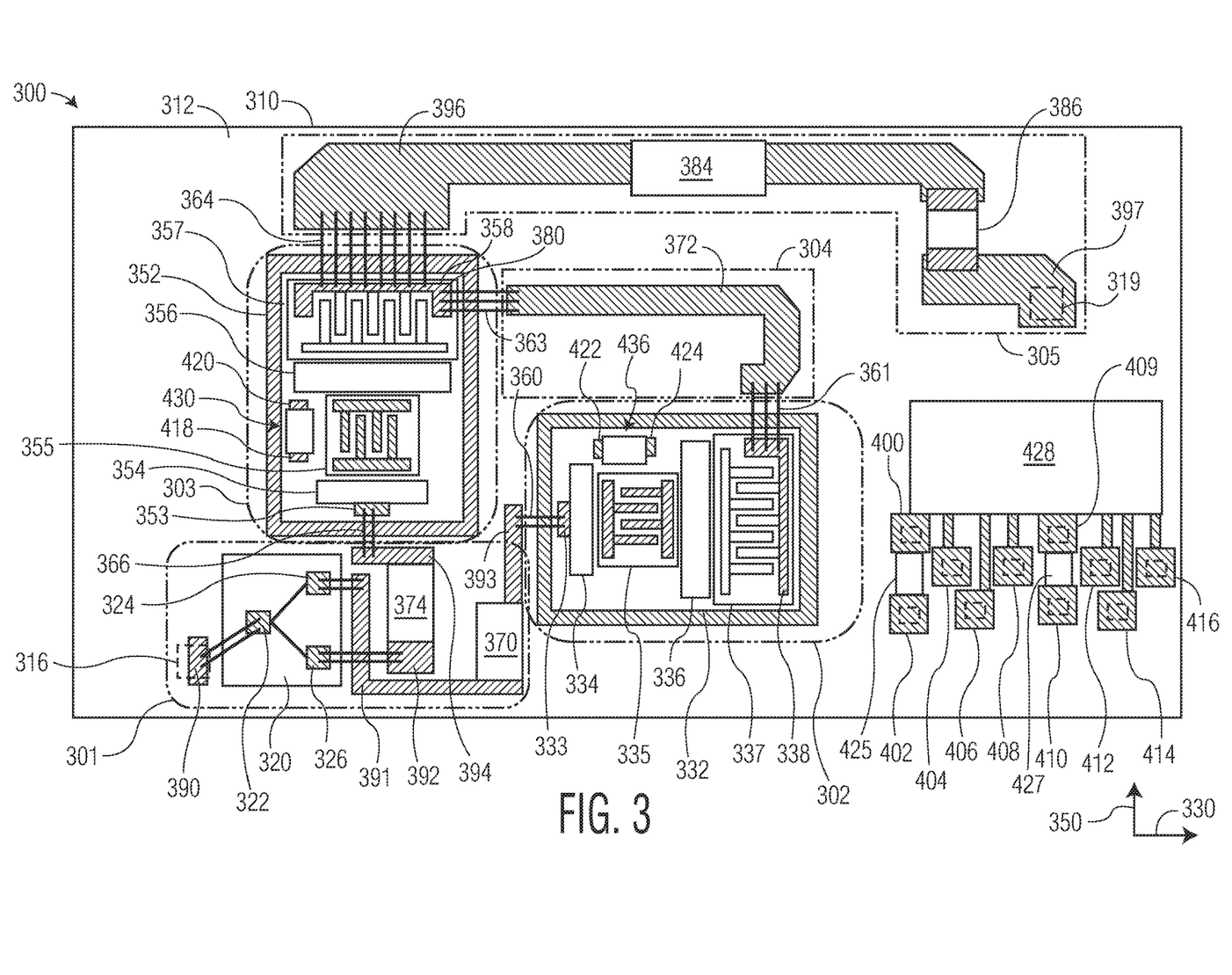
FIG. 3 is a top plan view of a Doherty amplifier module, in which a Doherty amplifier system such as that of FIG. 1 and FIG. 2 can be implemented, in accordance with an example embodiment.

An embodiment of a physical implementation of the Doherty amplifier system 20 of FIG. 1 and FIG. 2 will now be described in detail in conjunction with FIG. 3. More specifically, FIG. 3 is a top plan view of a Doherty amplifier module 300, in accordance with an example embodiment. The Doherty amplifier module 300 includes a substrate 310, a power splitter 320 (e.g. the power splitter 6 of FIG. 1), a carrier amplifier die 332 comprising the dual stage carrier amplifier 26 of FIG. 1 and FIG. 2, a peaking amplifier die 352 comprising the dual stage peaking amplifier 24 of FIG. 1 and FIG. 2, a phase shift and impedance inversion element 372 (e.g. second phase shift/impedance inversion/matching component 12 of FIG. 1), a bias controller 428 (e.g., bias controller 28, FIG. 2), and various other circuit elements, which will be discussed in more detail below.

The Doherty amplifier module 300 may be implemented as a land grid array (LGA) module, for example. Accordingly, the substrate 310 has a component mounting surface 312 and a land surface (not illustrated). The component mounting surface 312 and the components mounted to that surface 312 optionally may be covered with an encapsulant material (e.g., a plastic encapsulant). In an alternate embodiment, the components can be contained within an air cavity, which is defined by various structures (not illustrated) overlying the mounting surface 312.

According to an embodiment, the substrate 310 is relatively small, which provides for a particularly compact Doherty amplifier. For example, the component mounting surface 312 may have a width (horizontal dimension in FIG. 3) and a length (vertical dimension in FIG. 3) in a range of about 5 millimeters (mm) to about 20 mm, although the width and/or length may be smaller or larger, as well. In a particular embodiment, for example, the component mounting surface may have a width of about 10 millimeters (mm) and a length of about 6 mm.

For example, the substrate 310 may be a multi-layer organic substrate (e.g., formed from PCB materials) with a plurality of metal layers which are separated by dielectric material. According to an embodiment, the bottom metal layer is utilized to provide externally-accessible, conductive landing pads of the LGA, where the locations of some example landing pads are indicated with dashed boxes in FIG. 3. These landing pads (among others, not illustrated) enable surface mounting of the Doherty amplifier module 300 onto a separate substrate (not illustrated) that provides electrical connectivity to other portions of an RF system. Although the module 300 is depicted as an LGA module, the module 300 alternatively may be packaged as a pin grid array module, a quad flat no leads (QFN) module, or another type of package.

One or more metal layers of the substrate 310 may be used to convey DC voltages (e.g., DC bias voltages) and to provide a ground reference. Other layers may be used to convey RF and other signals through the module 300. Additionally, a patterned metal layer may be formed on the mounting surface 312 of the substrate 310. As will be discussed in more detail below, the patterned metal layer may include a plurality of conductive contacts and traces on the mounting surface 312, which facilitate electrical connection to die and other components that may be mounted to the mounting surface 312. In addition, the phase shift and impedance inversion element 372 may be formed from a portion of the patterned metal layer or from portions of one or more other conductive layers. Conductive vias can be provided for electrical connectivity between the metal layers.

Each of the carrier and peaking amplifier dies 332 and 352 is a monolithic power transistor integrated circuit (IC) that may produce significant amounts of heat during operation. In addition, each of the carrier and peaking amplifier dies 332 and 352 also needs access to a ground reference. Accordingly, in an embodiment, the substrate 310 also includes a plurality of electrically and thermally conductive trenches to which the carrier and peaking amplifier dies 332 and 352 are coupled (e.g., with solder, brazing material, silver sinter, or other die attach materials). The trenches extend through the substrate thickness in first-die and second-die mounting zones 302, 303 to provide heat sinks and ground reference access to the carrier and peaking amplifier dies 332 and 352. For example, the conductive trenches may be filled with copper or another thermally and electrically conductive material. In alternate embodiments, the trenches may be replaced with conductive slugs (e.g., copper slugs) or with thermal vias.

As seen in FIG. 3, a plurality of non-overlapping zones are defined at the mounting surface 312 of the substrate 310. More specifically, the non-overlapping zones include an input signal and splitter zone 301, the first-die mounting zone 302, the second-die mounting zone 303, an inter-amplifier impedance inverter zone 304, and an output match zone 305. Within the input signal and splitter zone 301, a conductive landing pad 316 exposed at the land surface is electrically coupled through the substrate 310 to a conductive contact 390 at the mounting surface 312. The landing pad 316 and the contact 390, along with the electrical connections between them, function as an RF input node (e.g. RF input node 2 of FIG. 1) for the module 300.

The power splitter 320 is coupled to the mounting surface 312 in the input signal zone 301. According to an embodiment, the power splitter 320 may include one or more discrete dies and/or components, although it is represented in FIG. 3 as a single element. The power splitter 320 includes an input terminal 322 and two output terminals 324, 326. The input terminal 322 is electrically coupled (e.g., through wirebonds, as shown) to the conductive contact 390 to receive an input RF signal. In addition, the output terminals 324, 326 are respectively electrically coupled (e.g., through additional wirebonds, as shown) to respective conductive contacts 391, 392 at the mounting surface 312. The power splitter 320 is configured to split the power of the input RF signal received through the input terminal 322 into first and second RF signals (e.g., carrier and peaking signals), which are produced at the output terminals 324, 326. In addition, the power splitter 320 may include a first phase shift element configured to impart about a 90 degree phase shift to the RF signal provided at the output terminal 326, as compared with the RF signal provided at the output terminal 324 (e.g., represented by the first phase shift/impedance inversion/matching component 10 of FIG. 1). The power splitter 320 may consist of fixed-value, passive components, or the power splitter 320 may include variable phase shifters and/or attenuators.

The first and second RF signals may have equal or unequal power. The first RF signal produced at the output terminal 324 and conveyed to the conductive contact 391 is amplified through a carrier amplifier path. The carrier amplifier path includes an input circuit 370 mounted within the input signal zone 301, the carrier amplifier die 332 mounted within the first-die mounting zone 302, and the impedance inversion element 372 connected to the substrate 310 within the inter-amplifier impedance inverter zone 304.

The input circuit 370 is electrically connected between the conductive contact 391 and a conductive contact 393. Although the detail is not shown in FIG. 3, the input circuit 370 may include a plurality of discrete and/or integrated components (e.g., inductors and capacitors) configured to provide proper impedance matching between the output terminal 324 and the input to the carrier die 332.

The conductive contact 393 is electrically coupled (e.g., with wirebonds 360) to an RF input terminal 333 of the carrier amplifier die 332, in order to provide an RF carrier signal for amplification to the carrier amplifier die 332. The illustrated embodiment of the carrier amplifier die 332 embodies a two-stage amplifier. More specifically, the electrical components of the carrier amplifier die 332 include the RF input terminal 333, an input matching network 334, a driver transistor 335 (e.g., the third PA device 38 of FIG. 2), an interstage matching network 336, an output transistor 337 (e.g., the fourth PA device 40 of FIG. 2), an RF output terminal 338, and the second reference device 436 (e.g., reference device 36, FIG. 3). The driver and output transistors 335, 337 are coupled in series between the input and output terminals 333, 338. The driver transistor 335 is configured to apply a relatively low gain to the carrier signal, and the output transistor 337 is configured to apply a relatively high gain to the carrier signal after preliminary amplification by the driver transistor 335. In other embodiments, the carrier amplifier die 332 may embody a single stage amplifier, or may include more than two amplification stages. As discussed above, the second reference device 436 is integrally formed on the carrier amplifier die 332 with the driver transistor 335 and the output transistor 337 to match the driver transistor 335 and the output transistor 337 in terms of part to part (die to die) process and temperature variations. As described in more detail below, bias circuitry connections 409, 410, 412, 414, 416, 422, and 424 may couple the second reference device 36 to both the bias controller 28 and one terminal of a second high tolerance drain resistor 427 (e.g., second high tolerance drain resistor 27, FIG. 2), and may couple portions of both the driver transistor 335 and the output transistor 337 to the bias controller 428.

Each of the transistors 335, 337 and the second reference device 436 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 335, 337 and the second reference device 436 may be a bipolar junction transistor (BJT). References herein to a "gate," "drain," and "source," which are commonly used to describe FETs, are not intended to be limiting, as each of these designations has analogous features for BJT implementations.

The input terminal 333 of die 332 is electrically coupled to the gate terminal of transistor 335 through the input matching network 334, and the drain terminal of transistor 335 is electrically coupled to the gate terminal of transistor 337 through the inter-stage matching network 336. According to an embodiment, the drain terminal of the transistor 337 is electrically coupled to the output terminal 338. Accordingly, the signal path through the carrier amplifier die 332 is in a direction extending from the RF input terminal 333 toward the RF output terminal 338, which direction is indicated by an arrow 330.

An amplified RF carrier signal is produced by the carrier amplifier die 332 at the RF output terminal 338. In an embodiment, the RF output terminal 338 is electrically coupled to a first end of phase shift and impedance inversion element 372, which is at least partially exposed at the mounting surface 312, with a first wirebond array 361 (e.g., a plurality of parallel, closely spaced wirebonds).

According to an embodiment, the RF output terminal 338 of the carrier amplifier die 332 includes an elongated first pad that is configured to enable wirebonds of the wirebond array 361 to be connected to the first pad so that the wirebonds extend in a direction that is angularly offset from (e.g., perpendicular to) the direction of the signal path through the carrier amplifier die 332 (e.g., wirebonds of the wirebond array 361 may extend in the direction indicated by an arrow 350).

As mentioned above, through the wirebond array 361, the RF output terminal 338 is electrically coupled to the phase shift and impedance inversion element 372, which is located in the inter-amplifier impedance inverter zone 304. According to an embodiment, the phase shift and impedance inversion element 372 is implemented with a transmission line (e.g., a microstrip line) having an electrical length of about lambda/4 ($\lambda$/4) or less. The transmission line has a first end that is proximate to the carrier amplifier die 332 (and more particularly within a wirebond length of the RF output terminal 338), and a second end that is proximate to the peaking amplifier die 352 (and more particularly within a wirebond length of a RF output terminal 358 of the peaking amplifier die 352). As used herein, "within a wirebond length" means within a distance between about 125 microns and about 200 microns, although the term may mean a smaller or larger distance, as well. According to an embodiment, the phase shift and impedance inversion element 372 may be formed from a portion of one or more of the metal layers of the module substrate 310 and/or may be formed on a surface of the module substrate 310.

Moving back to the power splitter 320 in the input signal and splitter zone 301, the second RF signal (e.g., the peaking signal) produced at the output terminal 326 of the power splitter 320 and conveyed to the conductive contact 392 is amplified through a peaking amplifier path. The peaking amplifier path includes an input circuit 374 within the input signal and splitter zone 301, and the peaking amplifier die 352 mounted within the second-die mounting zone 303. As mentioned above, the power splitter 320 may impart about a 90 degree phase shift to the RF signal provided at the output terminal 326. Accordingly, the phase of the peaking signal received at an input terminal 353 of the peaking die 352 is delayed by about 90 degrees with respect to the carrier signal received at the input terminal 333 of the carrier die 332.

The input circuit 374 is electrically connected between the conductive contact 392 and a conductive contact 394. Although the detail is not shown in FIG. 3, the input circuit 374 may include a plurality of discrete and/or integrated components (e.g., inductors and capacitors) configured to provide proper impedance matching between the output terminal 326 and the input to the peaking die 352.

The conductive contact 394 is electrically coupled (e.g., with wirebonds 366) to the RF input terminal 353 of the peaking amplifier die 352, in order to provide an RF peaking signal for amplification to the peaking amplifier die 352. The illustrated embodiment of peaking amplifier die 352 also embodies a two-stage amplifier. More specifically, the electrical components of peaking amplifier die 352 include the RF input terminal 353, an input matching network 354, a driver transistor 355, an interstage matching network 356, an output transistor 357, the RF output terminal 358, and the first reference device 430 (e.g., reference device 30, FIG. 2). The driver and output transistors 355, 357 are coupled in series between the input and output terminals 353, 358. The driver transistor 355 is configured to apply a relatively low gain to the peaking signal, and the output transistor 357 is configured to apply a relatively high gain to the peaking signal after preliminary amplification by the driver transistor 355. In other embodiments, the peaking amplifier die 352 may embody a single stage amplifier, or may include more than two amplification stages. As discussed above, the first reference device 430 is integrally formed on the peaking amplifier die 352 with the driver transistor 355 and the output transistor 357 to match the driver transistor 355 and the output transistor 357 in terms of part to part (die to die) process and temperature variations. As described in more detail below, bias circuitry connections 400, 402, 404, 406, 408, 418, and 420 may couple the first reference device 430 to both the bias controller 428 and one terminal of the first high tolerance drain resistor 425 (e.g., resistor 25, FIG. 2), and portions of the driver transistor 355 and the output transistor 357 to the bias controller 428. Again, each of the transistors 355, 357 and the first reference device 430 may be a FET or a BJT.

The input terminal 353 of die 352 is electrically coupled to the gate terminal of transistor 355 through the input matching network 354, and the drain terminal of transistor 355 is electrically coupled to the gate terminal of transistor 357 through the inter-stage matching network 356. According to an embodiment, the drain terminal of transistor 357 is electrically coupled to output terminal 358. Accordingly, the signal path through the peaking amplifier die 352 is in a direction extending from the RF input terminal 353 toward the RF output terminal 358, which direction is indicated by the arrow 350.

An amplified RF peaking signal is produced by the peaking amplifier die 352 at the RF output terminal 358. In an embodiment, and as mentioned above, the RF output terminal 358 is electrically coupled to the impedance inversion element 372 with a first wirebond array 363, and the RF output terminal 358 functions as a combining node 380 (e.g. the combining node 8 of FIG. 1) at which the amplified and delayed carrier amplifier signal is combined, in phase, with an amplified peaking amplifier signal.

The RF output terminal 358 of the peaking amplifier die 352 includes an elongated first pad that is configured to enable wirebonds of the first wirebond array 363 to be connected to the first pad so that the wirebonds extend in a direction that is angularly offset from (e.g., perpendicular to) the direction of the signal path through the peaking amplifier die 352 (e.g., wirebonds 363 may extend in the direction indicated by the arrow 330). Further, the RF output terminal 358 may include an elongated second pad that is configured to enable the wirebonds of a second wirebond array 364 to be connected to the second pad so that the wirebonds extend in a direction that is substantially parallel to the direction of the signal path through the peaking amplifier die 352 (e.g., wirebonds of the wirebond array 364 may extend in the direction indicated by arrow 350).

The signal path through the peaking amplifier die 352 is in a direction extending from the RF input terminal 353 to the RF output terminal 358, which direction is indicated by the arrow 350. By contrast, the signal path through the carrier amplifier die 332 is in a direction extending from the RF input terminal 333 to the RF output terminal 338, which direction is indicated by the arrow 330. Thus, as can be seen in FIG. 3, the signal paths through the peaking and carrier amplifier dies 352, 332 extend in significantly different directions, and more particularly the signal paths are perpendicular in the embodiment of FIG. 3.

According to an embodiment, except for the configurations of the RF output terminals 338, 358, the peaking amplifier die 352 may be structurally identical to the carrier amplifier die 332, meaning that the two die 332, 352 include the same structural and electrical elements arranged and interconnected in the same manner. According to a further embodiment, the peaking amplifier die 352 and the carrier amplifier die 332 also are identical in size, rendering the Doherty amplifier module 300 a symmetric Doherty amplifier. In an alternate embodiment, the peaking amplifier die 352 and the carrier amplifier die 332 may have different sizes, rendering the Doherty amplifier module 300 an asymmetric Doherty amplifier. For example, the peaking amplifier die 352 may be larger than the carrier amplifier die 332 by a ratio (e.g., 1.6:1, 2:1, or some other ratio).

Either way, each die 332, 352 is rectangular in shape with parallel first and second sides, and parallel third and fourth sides extending between the first and second sides. In each die 332, 352, the RF input terminal 333, 353 is proximate to the first side of the die, and portions of the RF output terminal 338, 358 may be proximate to the second side of the die. The first sides of the respective dies 332, 352 are each oriented toward the input signal zone 301, and the first sides of the dies 332, 352 are perpendicularly arranged, with respect to each other, in an embodiment. Said another way, the structurally identical carrier and peaking amplifier dies 332, 352 are coupled to the mounting surface 312 of the substrate 310 so that the dies 332, 352 are perpendicular to each other, rendering the RF signal paths through the dies 332, 352 also perpendicular to each other. Even though the dies 332, 352 may be positioned relatively close together, their perpendicular orientations may significantly reduce coupling between signals carried through and amplified by the dies 332, 352.

As mentioned above, through the wirebond array 363, the RF output terminal 358 is electrically coupled to phase shift and impedance inversion element 372. Accordingly, the amplified carrier signal produced by the carrier amplifier die 332 is received at the RF output terminal 358 of the peaking amplifier die 352 through the wirebond array 361, phase shift and impedance inversion element 372, and wirebond array 363. The amplified peaking signal produced by the peaking amplifier die 352 also is received at the RF output terminal 358, and the module 300 is configured so that the amplified carrier and peaking signals arrive and are combined at output terminal 358 (or combining node 380) in phase with each other.

According to an embodiment, the RF output terminal 358 (or combining node 380) is electrically coupled to a conductive output trace 396 at the mounting surface 312 with the wirebond array 364. As illustrated in FIG. 3, the wirebonds of the wirebond array 364 are aligned in the same direction as the RF signal path through the peaking amplifier die 352 (e.g., in the direction indicated by arrow 350). In an embodiment, the wirebond arrays 363, 364 are perpendicularly arranged with respect to each other at adjacent sides of die 352. Accordingly, even though the wirebond arrays 363, 364 may be positioned relatively close together, their perpendicular orientations may significantly reduce coupling of RF signals carried through the wirebond arrays 363, 364.

An output impedance matching network 384 (e.g., third phase shift/impedance inversion/matching component 14 of FIG. 1) and/or a decoupling capacitor 386 may be coupled along the output trace 396, in an embodiment. The output impedance matching network 384 functions to present the proper load impedance to the combining node 380. Although the detail is not shown in FIG. 3, the output impedance matching network 384 may include various discrete and/or integrated components (e.g., capacitors, inductors, and/or resistors) to provide the desired impedance matching. The output impedance matching network 384 is electrically coupled through the substrate 310 to a conductive landing pad 319 exposed at the land surface. The landing pad 319 functions as an RF output node (e.g., RF output node 4 of FIG. 1) for the module 300.

Module 300 also may include the first and second high tolerance drain resistors 425, 427 (e.g., discrete surface mount resistors corresponding to resistors 25, 27, FIG. 2) and the bias circuitry connections 400, 402, 404, 406, 408, 409, 410, 412, 414, 416, 418, 420, 422, and 424 configured to couple portions of the driver and output transistors 335, 355, 337, 357 and portions of the first and second reference devices 430 and 436 to the bias controller 428. According to an embodiment, the bias controller 428 embodies the circuitry of bias controller 28, FIG. 2, including the first and second comparator circuits 44, 52, and the plurality of DACs 46, 48, 54, 56, FIG. 2. Bias controller 428 also may include one or more voltage sources (e.g., voltage sources 42, 50, FIG. 2), or such voltage sources may be separate from bias controller 428, with appropriate electrical connections between the voltage sources and bias controller 428. According to an embodiment, bias controller 428 may be implemented with a semiconductor die with bump connections on a top surface, where the die is flipped and the bump connections are aligned with and attached to corresponding contacts at the mounting surface 312 of the module substrate 310. In an alternate embodiment, the bias controller 428 may be implemented, for example, as a surface mount device (e.g., a QFN device) with a plurality of contacts at a bottom surface, which are configured to align and connect with corresponding contacts at the mounting surface 312 of the module substrate 310.

In addition to bias controller 428, the bias circuitry may include, among other things, a plurality of landing pads (at the land surface of the substrate 310), contacts (at the mounting surface 312 of the substrate 310), and other conductive structures and circuitry, such as wirebonds, conductive vias and routing structures within the module substrate 310. An electrical connection between the bias controller 428 and each of the various transistors 335, 337, 355, 357, 430, 436 may include, for example, a first contact of the bias controller 428 (e.g., on a top or bottom surface of the bias controller 428), a corresponding second contact on the mounting surface 312 of the module substrate 310, a conductive path through the module substrate 310 (e.g., including conductive vias and routing traces) between the second contact and a third contact on the mounting surface 312 of the module substrate 310, and one or more wirebonds (not illustrated) between the third contact and a fourth contact on the top surface of the carrier or peaking die 332, 352, where the fourth contact is electrically connected to a corresponding transistor 335, 337, 355, 357, 430, 436. In an alternate embodiment, the carrier and peaking dies 332, 352 also may be flip-chip dies with bump connections on a top surface that are configured to align with and connect to corresponding contacts at the mounting surface 312 of the module substrate 310.

For example, in the present example embodiment of FIG. 3, contacts 418, 420 may be electrically connected within die 352 to the drain and gate, respectively, of reference device 430, and contacts 422, 424 may be electrically connected within die 332 to the drain and gate, respectively, of reference device 436. Additional contacts (not shown) on the top surfaces of dies 332, 352 may connect to the gate of transistor 335, the gate of transistor 337, the gate of transistor 355, and the gate of transistor 357.

The bias circuitry connection 400 may be electrically connected with the bias circuitry connection 418 through various conductive structures (e.g., vias, traces, wirebonds) to couple the drain of the first reference device 430 to one terminal of the first high tolerance drain resistor 425 and to a first input of the bias controller 428, where the first input of the bias controller 428, in turn, is internally connected to an input to a comparator circuit (e.g., the second input 45 to the first comparator circuit 44 of FIG. 2). The bias circuitry connection 402 couples a second terminal of the first high tolerance drain resistor 425 to a DC voltage source (e.g., DC voltage source 21, FIG. 2). The bias circuitry connection 404 connects with the bias circuitry connection 420 through various conductive structures (e.g., vias, traces, wirebonds) to couple the gate of the first reference device 430 to a first output of the bias controller 428 (e.g., the output 47 of the first comparator circuit 44 of FIG. 2). The bias circuitry connection 406 couples the gate of the drive transistor 355 (e.g. the transistor 32 of FIG. 2) to a second output of the bias controller 428 (e.g. the output 49 of the first programmable DAC 46 of FIG. 2) through various conductive structures (e.g., vias, traces, wirebonds), and the bias circuitry connection 408 couples the gate of the output transistor 357 (e.g. the transistor 34 of FIG. 2) to a third output of the bias controller 428 (e.g. the output 51 of the second programmable DAC 48 of FIG. 2) through various conductive structures (e.g., vias, traces, wirebonds).

Correspondingly, in the present example embodiment, the bias circuitry connection 409 connects with the bias circuitry connection 422 through various conductive structures (e.g., vias, traces, wirebonds) to couple the drain of the second reference device 436 to one terminal of the second high tolerance drain resistor 427 and a second input of the bias controller 428, where the second input of the bias controller 428, in turn, is internally connected to an input to a comparator circuit (e.g. the second input 55 to the second comparator circuit 52 of FIG. 2). The bias circuitry connection 410 couples a second terminal of the second high tolerance drain resistor 427 to the DC voltage source (e.g., DC voltage source 23, FIG. 2). The bias circuitry connection 412 connects with the bias circuitry connection 424 through various conductive structures (e.g., vias, traces, wirebonds) to couple the gate of the second reference device 436 to a fourth output of the bias controller 428 (e.g. the output 57 of the second comparator circuit 52 of FIG. 2). The bias circuitry connection 414 couples the gate of the drive transistor 335 to a fifth output of the bias controller 428 (e.g. the output 59 of the third programmable DAC 54 of FIG. 2) through various conductive structures (e.g., vias, traces, wirebonds), and the bias circuitry connection 416 couples the gate of the output transistor 337 to a sixth output of the bias controller 428 (e.g. the output 61 of the fourth programmable DAC 56 of FIG. 2) through various conductive structures (e.g., vias, traces, wirebonds).

The bias controller 428 provides appropriate bias voltages to the transistors 335, 337 of the carrier amplifier die 332 and the transistors 355, 357 of the peaking amplifier die 352 based on signals received from the first and second reference devices 430 and 436 as described above in connection with FIG. 2. For example, the bias controller 428 may bias the transistors 335, 337 of the carrier amplifier die 332 to operate in class AB (or class C) mode, and the transistors 355, 357 of the peaking amplifier die 352 to operate in class C (or class AB) mode.

Figure 4:
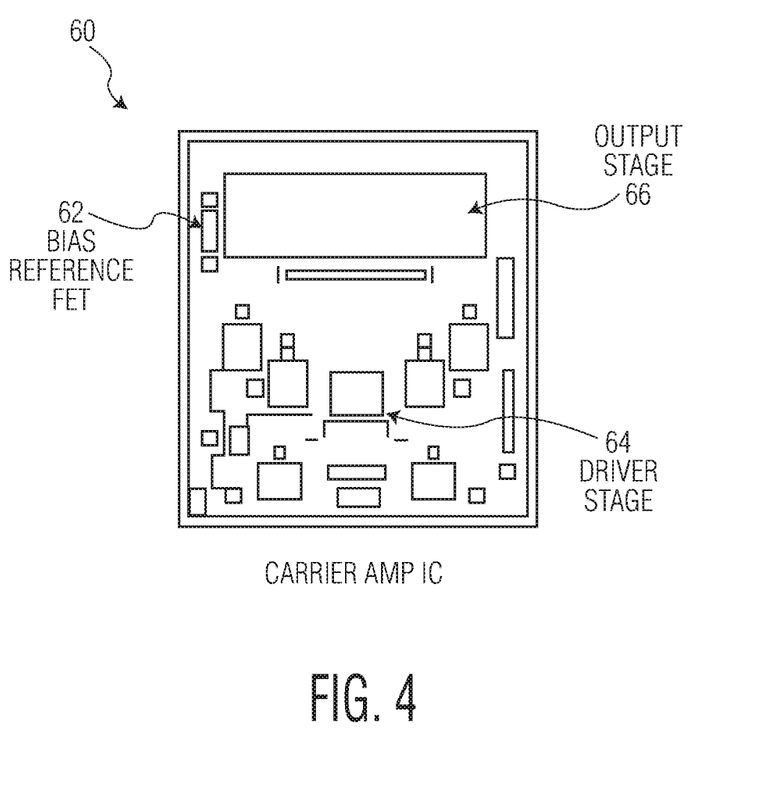
FIG. 4 is a top plan view of an amplifier integrated circuit that can form a part of a Doherty amplifier module such as that of FIG. 3, in accordance with an example embodiment.

FIG. 4 is a top view of an amplifier integrated circuit die 60. The amplifier integrated circuit die 60 can include a reference device transistor 62, a driver stage transistor 64 and an output stage transistor 66 integrated together on the die 60 to have matching part to part (die to die) process and temperature variations. As seen in FIG. 4, the reference device transistor 62 can be significantly smaller than the driver stage transistor 64 and the output stage transistor 66. The amplifier integrated circuit die 60 can be used for either or both of the carrier amplifier die 332 and the peaking amplifier die 352 of FIG. 3.

Figure 5:
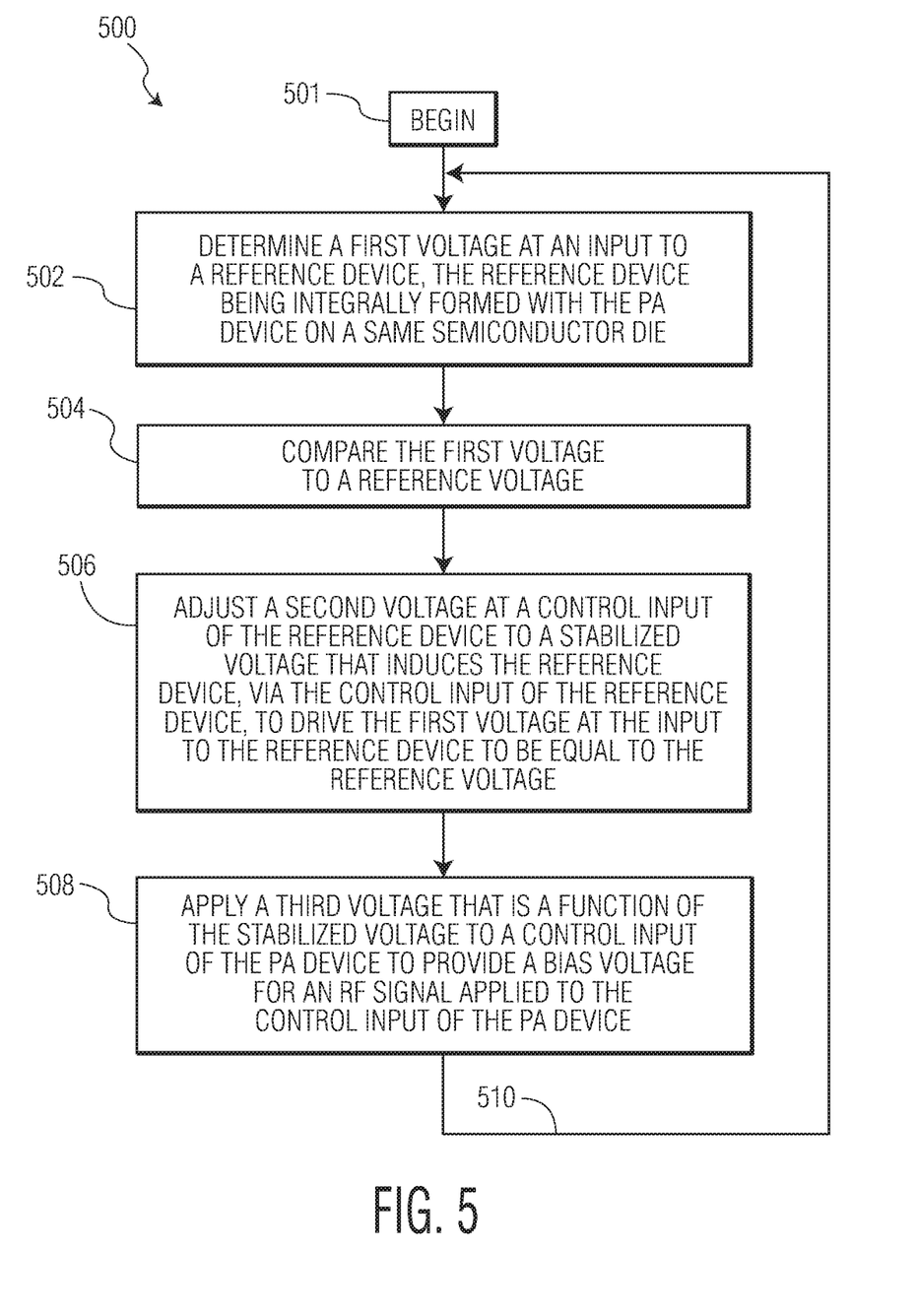
FIG. 5 is a flowchart of a method of operating a Doherty amplifier module such as that of FIG. 3, in accordance with an example embodiment.

FIG. 5 is a flow diagram of a method of operation 500 for both the Doherty amplifier system 20 of FIG. 1 and FIG. 2 and the Doherty amplifier module 300 of FIG. 3. As seen in FIG. 5, the method 500 upon commencing at a begin step 501 can start by receiving or determining (e.g., by bias controller 28, 428) a first voltage at an input (e.g., node 31, 33) to a reference device (e.g. first or second reference devices 30, 36, 62, 430, 436) that is integrally formed on the same semiconductor die (e.g. die 60, carrier amplifier die 332 or peaking amplifier die 352) with a power amplifier device (e.g. first, second, third, fourth PA devices 32, 34, 38, 40, 64, 66, 335, 337, 355, 357), as at a step 502. The method 500 can then include comparing (e.g., by comparator 44, 52) the first voltage to a reference voltage (e.g., from voltage source 42, 50), as at a step 504, and adjusting a second voltage at a control input (e.g., a gate) of the reference device to a stabilized voltage that induces the reference device, via the control input of the reference device, to drive the first voltage at the input to the reference device to be equal to the reference voltage, as at a step 506. Next, the method 500 can include providing (e.g., by comparator 44, 52 and DACs 46, 48, 54, 56) a third voltage that is a function of the stabilized voltage to a control input (e.g., a gate) of the power amplifier device (e.g., transistor 32, 34, 38, 40, 64, 66, 335, 337, 355, 357) to provide a bias voltage for an RF signal applied to the control input of the power amplifier device, as at a step 508. Finally, after completion of the step 508, the method 510 can be repeated when required, as represented by an arrow 510.

The present disclosure is intended to encompass numerous embodiments in addition to that described above. For example, although the above-described configuration of FIG. 3 corresponds to a non-inverted Doherty amplifier, in an alternate embodiment, modifications can be made to configure the module 300 to operate as an inverted Doherty amplifier. Additionally, although the above described embodiments include two-way Doherty power amplifier implementations, which include a carrier amplifier and one peaking amplifier, other embodiments are intended to be encompassed herein. Further for example, according to some such other embodiments, a Doherty power amplifier may include more than one peaking amplifier, or the module 300 may be modified to implement types of amplifiers other than Doherty amplifiers. Said another way, modules configured to work with the bias controller 28, 428 or other bias controllers of a substantially or largely similar form may be utilized in amplifier configurations other than those illustrated and discussed herein. Notwithstanding the above description concerning FIG. 5, the present disclosure is also intended to encompass numerous other embodiments of methods of operating amplifiers and amplifier systems. Indeed, various modifications may be made to the module 300 without departing from the scope of the present disclosure.

Additionally, in at least some embodiments, the present disclosure additionally relates to a system including a first power amplifier (PA) die having a first PA device, and a first reference device integrally formed in the first PA die with the first PA device. The system can also include a bias voltage generator that includes a first comparator circuit. A first input of the first comparator circuit is configured to receive a first reference voltage. A second input of the first comparator circuit is electrically coupled to an output port of the first reference device, and a control input of the first reference device is coupled to the output of the first comparator circuit. The first comparator circuit compares the first reference voltage to a further voltage applied to the second input and adjusts an output voltage at the output of the first comparator circuit to attain a first stabilized voltage that induces the first reference device, via the control input of the first reference device, to drive the further voltage to equal the first reference voltage. When the first comparator circuit produces the first stabilized voltage, a first control voltage that is a function of the first stabilized voltage is applied to the input of the first PA device. The first control voltage provides a first bias voltage for a first radio frequency signal applied to the input of the first PA device.

Additionally, in at least some embodiments, the present disclosure additionally relates to an amplifier including a substrate with a mounting surface and a first amplifier die coupled to the substrate. The first amplifier die includes a first power amplifier (PA) device and a first reference device. The first reference device is integrally formed in the first amplifier die with the first PA device. The amplifier can also include a bias controller die coupled to the mounting surface. The bias controller die includes a first comparator circuit. A first input of the first comparator circuit is configured to receive a first reference voltage. A second input of the first comparator circuit is electrically coupled to an output port of the first reference device. A control input of the first reference device is coupled to the output of the first comparator circuit.

Furthermore, the first comparator circuit compares the first reference voltage to a further voltage applied to the second input of the first comparator circuit by the first reference device and adjusts an output voltage at the output of the first comparator circuit to attain a first stabilized voltage. The first stabilized voltage induces the first reference device, via the control input of the first reference device, to drive the further voltage to equal the first reference voltage. When the first comparator circuit produces the first stabilized voltage, a first control voltage that is a function of the first stabilized voltage is applied to the input of the first PA device. The first control voltage provides a first bias voltage for a first radio frequency signal applied to the input of the first PA device Additionally, in at least some embodiments, the present disclosure additionally relates to a method. The method can include determining a first voltage at an input to a reference device that is integrally formed with the PA device on a same semiconductor die. The method can also include comparing the first voltage to a reference voltage and adjusting a second voltage at a control input of the reference device to a stabilized voltage. The stabilized voltage can induce the reference device, via the control input of the reference device, to drive the first voltage at the input to the reference device equal to the reference voltage. The method can also include providing a third voltage that is a function of the stabilized voltage to a control input of the PA device to provide a bias voltage for an RF signal applied to the control input of the PA device.

In view of the above description, it should be appreciated that, depending upon the embodiment, one or more of the embodiments of amplifiers, systems employing amplifiers, and/or related methods described herein or encompassed by the present disclosure can achieve operation that is advantageous in one or more respects. For example, such systems and methods as described herein can facilitate dynamic generation of suitable bias voltage(s) for power amplifier components by monitoring voltage drops across the high tolerance drain resistors coupled to reference devices that are integrally formed with the power amplifier components.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

Accordingly, it is specifically intended that the present invention not be limited to the embodiments and illustrations contained herein, but include modified forms of those embodiments including portions of the embodiments and combinations of elements of different embodiments as come within the scope of the following claims.

What is claimed is:

1. A system comprising:
   a first power amplifier (PA) die that includes
      a first PA device, and
      a first reference device integrally formed in the first PA die with the first PA device;
   a bias voltage generator that includes a first comparator circuit,
   wherein a first input of the first comparator circuit is configured to receive a first reference voltage, wherein a second input of the first comparator circuit is electrically coupled to an output port of the first reference device, and wherein a control input of the first reference device is coupled to the output of the first comparator circuit,
   wherein the first comparator circuit compares the first reference voltage to a further voltage applied to the second input and adjusts an output voltage at the output of the first comparator circuit to attain a first stabilized voltage that induces the first reference device, via the control input of the first reference device, to drive the further voltage to equal the first reference voltage, wherein, when the first comparator circuit produces the first stabilized voltage, a first control voltage that is a function of the first stabilized voltage is applied to the input of the first PA device, and
  wherein the first control voltage provides a first bias voltage for a first radio frequency signal applied to the input of the first PA device;
a second PA device integrally formed in the first PA die,
  wherein, when the first comparator circuit produces the first stabilized voltage, a second control voltage that is a function of the first stabilized voltage is applied to the input of the second PA device, and
  wherein the second control voltage provides a second bias voltage for a second ratio frequency signal applied to the input of the second PA device;
a second PA die that includes
  a third PA device,
  a fourth PA device, and
  a second reference device;
a second comparator circuit of the bias voltage generator;
  wherein a first input of the second comparator is configured to receive a second reference voltage, wherein a second input of the second comparator circuit is electrically coupled to an output port of the second reference device, and wherein a control input of the second reference device is coupled to the output of the second comparator circuit,
  wherein the second comparator circuit compares the second reference voltage to an additional voltage applied to the second input of the second comparator circuit and adjusts an output voltage at the output of the second comparator circuit to attain a second stabilized voltage that induces the second reference device, via the control input of the second reference device, to drive the additional voltage to equal the second reference voltage,
  wherein, when the second comparator circuit produces the second stabilized voltage, a third control voltage that is a function of the second stabilized voltage is applied to the input of the third PA device and a fourth control voltage that is a function of the second stabilized voltage is applied to the input of the fourth PA device, and
  wherein the third control voltage provides a third bias voltage for a third radio frequency signal applied to the input of the third PA device and the fourth control voltage provides a fourth bias voltage for a fourth radio frequency signal applied to the input of the fourth PA device.

2. The system of claim 1, further comprising:
a first programmable voltage source configured to produce the first reference voltage; and
a second programmable voltage source configured to produce the second reference voltage,
wherein the first programmable voltage source is identical or substantially identical to the second programmable voltage source, and the first reference voltage equals or substantially equals the second reference voltage.

3. The system of claim 1, wherein the first reference device is integrally formed on a first integrated circuit die with the first PA device and the second PA device, and the second reference device is integrally formed on a second integrated circuit die with the third PA device and the fourth PA device.

4. The system of claim 1, wherein the system includes a Doherty power amplifier, the first power amplifier is a carrier amplifier and the second power amplifier is a peaking amplifier.

5. The system of claim 1, wherein the first reference device is smaller than the first PA device and the second PA device, and the second reference device is smaller than the third PA device and the fourth PA device.

6. The system of claim 1, further comprising:
a first digital to analog converter (DAC) of the bias voltage generator electrically coupled between an output of the first comparator circuit and an input of the first PA device that offsets the first stabilized voltage by a first offset voltage to produce the first control voltage;
a second DAC of the bias voltage generator electrically coupled between the output of the first comparator circuit and an input of the second PA device that offsets the first stabilized voltage by a second offset voltage to produce the second control voltage;
a third DAC of the bias voltage generator electrically coupled between an output of the second comparator circuit and an input of the third PA device that offsets the second stabilized voltage by a third offset voltage to produce the third control voltage; and
a fourth DAC of the bias voltage generator electrically coupled between the output of the second comparator circuit and an input of the fourth PA device that offsets the second stabilized voltage by a fourth offset voltage to produce the fourth control voltage,
wherein the first offset voltage and the second offset voltage are preconfigured to drive the first and second PA devices to operate in a class C mode, and
wherein the third offset voltage and the fourth offset voltage are preconfigured to drive the third and fourth PA devices to operate in a class AB mode.

7. The system of claim 1, wherein the voltage at the output port of the first reference device is measured as a voltage drop across a first reference resistor electrically coupled between the output port of the first reference device and the source voltage.

8. The system of claim 7, wherein the voltage applied to the control input of the first reference device induces a current flow through the first reference device, and wherein the current flow through the first reference device is equal to a current flow through the first reference resistor.

9. An amplifier comprising:
a substrate with a mounting surface;
a first amplifier die coupled to the substrate, the first amplifier die including a first power amplifier (PA) device and a first reference device integrally formed in the first amplifier die with the first PA device;
a bias controller die coupled to the substrate, wherein the bias controller die includes a first comparator circuit,
wherein a first input of the first comparator circuit is configured to receive a first reference voltage, wherein a second input of the first comparator circuit is electrically coupled to an output port of the first reference device, wherein a control input of the first reference device is coupled to the output of the first comparator circuit,
wherein the first comparator circuit compares the first reference voltage to a further voltage applied to the second input of the first comparator circuit by the first reference device and adjusts an output voltage at the output of the first comparator circuit to attain a first stabilized voltage that induces the first reference device, via the control input of the first reference device, to drive the further voltage to equal to the first reference voltage, wherein, when the first comparator circuit produces the first stabilized voltage, a first control voltage that is a function of the first stabilized voltage is applied to the input of the first PA device, and wherein the first control voltage provides a first bias voltage for a first radio frequency signal applied to the input of the first PA device;

a second amplifier die couple to the substrate; the second amplifier die comprising a second PA device and a second reference device integrally formed in the second amplifier die with the second PA device, wherein the bias controller die includes a second comparator circuit, wherein a first input of the second comparator circuit is configured to receive a second reference voltage, wherein a second input of the second comparator circuit is electrically coupled to an output port of the second reference device, and wherein a control input of the second reference device is couple to the output of the second comparator circuit, wherein the second comparator circuit compares the second reference voltage to an additional voltage applied to the second input of the second comparator circuit by the second reference device and adjusts an output voltage at the output of the second comparator circuit to attain a second stabilized voltage that induces the second reference device, via the control input of the second reference device, to drive the additional voltage to equal to the second reference voltage, wherein, when the second comparator circuit produces the second stabilized voltage, a second control voltage that is a function of the second stabilized voltage is applied to the input of the second PA device, and wherein the second control voltage provides a second bias voltage for a second radio frequency signal applied to the input of the second PA device.

10. The amplifier of claim 9 further comprising:
a third PA device integrally formed in the first amplifier die;
a fourth PA device integrally formed in the second amplifier die;
wherein a third control voltage that is a function of the first stabilized voltage is applied to the input of the third PA device and a fourth control voltage that is a function of the second stabilized voltage is applied to the input of the fourth PA device, and
wherein the third control voltage provides a third bias voltage for a third radio frequency signal applied to the input of the third PA device and the fourth control voltage provides a fourth bias voltage for a fourth radio frequency signal applied to the input of the fourth PA device.

11. The Amplifier of claim 10, further comprising:
a first digital to analog converter (DAC) of the bias voltage generator electrically coupled between an output of the first comparator circuit and an input of the first PA device that offsets the first stabilized voltage by a first offset voltage to produce the first control voltage;
a second DAC of the bias voltage generator electrically coupled between the output of the second comparator circuit and an input of the second PA device that offsets the second stabilized voltage by a second offset voltage to produce the second control voltage;
a third DAC of the bias voltage generator electrically coupled between an output of the first comparator circuit and an input of the third PA device that offsets the first stabilized voltage by a third offset voltage to produce the third control voltage; and
a fourth DAC of the bias voltage generator electrically coupled between the output of the second comparator circuit and an input of the fourth PA device that offsets the second stabilized voltage by a fourth offset voltage to produce the fourth control voltage,
wherein the first offset voltage and the third offset voltage are preconfigured to drive the first and third PA devices to operate in a class C mode, and
wherein the second offset voltage and the fourth offset voltage are preconfigured to drive the second and fourth PA devices to operate in a class AB mode.

12. The Amplifier of claim 10, wherein the first reference device is smaller than the first PA device and the second PA device, and the second reference device is smaller than the third PA device and the fourth PA device.

13. The Amplifier of claim 10, wherein the further voltage is measured as a first voltage drop across a first reference resistor electrically coupled between the output port of the first reference device and the source voltage, and wherein the additional voltage is measured as a second voltage drop across a second reference resistor electrically coupled between the output port of the second reference device and the source voltage.

14. The Amplifier of claim 13, wherein the voltage applied to the control input of the first reference device induces a first current flow through the first reference device and the voltage applied to the control input of the second reference device induces a second current flow through the second reference device, and wherein the first current flow through the first reference device is equal or substantially equal to a third current flow through the first reference resistor and the second current flow through the second reference device is equal to a fourth current flow through the second reference resistor.

15. A bias controller for a power amplifier, the bias controller comprising:
a first reference device source/drain interface;
a first reference device gate interface;
a first bias voltage generator that includes a first comparator circuit wherein a first input of the first comparator circuit is configured to receive a first reference voltage and a second input of the first comparator circuit is electrically coupled to the first reference device source/drain interface, and wherein an output of the first comparator circuit is coupled to the first reference device gate interface, wherein, during operation, the first comparator circuit is configured to compare the first reference voltage to a further voltage applied to the second input via the first reference device source/drain interface and to adjust an output voltage at the output of the first comparator circuit to attain a first stabilized voltage that induces a first reference device that is connected to the first reference device gate interface, to drive the further voltage to equal the first reference voltage;
a first power amplifier (PA) interface configured to output a first control voltage in response to the first stabilized voltage, wherein the first control voltage provides a first bias voltage for a first radio frequency signal applied to an input of a first PA device; and
a first programmable voltage source configured to produce the first reference voltage.

16. The bias controller of claim 15, further comprising a first digital to analog converter (DAC) electrically coupled between the output of the first comparator circuit and the first PA interface that offsets the first stabilized voltage by a first offset voltage to produce the first control voltage.

17. The bias controller of claim 15, further comprising:
a second PA interface configured to output a second control voltage in response to the first stabilized voltage.

18. The bias controller of claim 17, further comprising:
a first digital to analog converter (DAC) electrically coupled between the output of the first comparator circuit and the first PA interface that offsets the first stabilized voltage by a first offset voltage to produce the first control voltage; and
a second DAC electrically coupled between the output of the first comparator circuit and the second PA interface that offsets the first stabilized voltage by a second offset voltage to produce the second control voltage.

19. The bias controller of claim 15, further comprising:
a second PA interface configured to output a second control voltage in response to the first stabilized voltage;
a second reference device source/drain interface;
a second reference device gate interface;
a second bias voltage generator that includes a second comparator circuit wherein a first input of the second comparator circuit is configured to receive a second reference voltage and a second input of the second comparator circuit is electrically coupled to the second reference device source/drain interface, and wherein an output of the second comparator circuit is coupled to the second reference device gate interface, wherein, during operation, the second comparator circuit is configured to compare the second reference voltage to a further voltage applied to the second input via the second reference source/drain interface and to adjust an output voltage at the output of the second comparator circuit to attain a second stabilized voltage that induces a second reference device that is connected to the second reference gate interface, to drive the further voltage to equal the second reference voltage;
a third PA interface configured to output a third control voltage in response to the second stabilized voltage, wherein the third control voltage provides a third bias voltage for a third radio frequency signal applied to an input of a third PA device; and
a fourth PA interface configured to output a fourth control voltage in response to the second stabilized voltage, wherein the fourth control voltage provides a fourth bias voltage for a fourth radio frequency signal applied to an input of a fourth PA device.

20. The bias controller of claim 19, further comprising:
a first digital to analog converter (DAC) electrically coupled between the output of the first comparator circuit and the first PA interface that offsets the first stabilized voltage by a first offset voltage to produce the first control voltage;
a second DAC electrically coupled between the output of the first comparator circuit and the second PA interface that offsets the first stabilized voltage by a second offset voltage to produce the second control voltage;
a third DAC electrically coupled between the output of the second comparator circuit and the third PA interface that offsets the second stabilized voltage by a third offset voltage to produce the third control voltage; and
a fourth DAC electrically coupled between the output of the second comparator circuit and the fourth PA interface that offsets the second stabilized voltage by a fourth offset voltage to produce the fourth control voltage.

21. A bias controller for a power amplifier, the bias controller comprising:
a first reference device source/drain interface;
a first reference device gate interface;
a first bias voltage generator that includes a first comparator circuit wherein a first input of the first comparator circuit is configured to receive a first reference voltage and a second input of the first comparator circuit is electrically coupled to the first reference device source/drain interface, and wherein an output of the first comparator circuit is coupled to the first reference device gate interface, wherein, during operation, the first comparator circuit is configured to compare the first reference voltage to a further voltage applied to the second input via the first reference device source/drain interface and to adjust an output voltage at the output of the first comparator circuit to attain a first stabilized voltage that induces a first reference device that is connected to the first reference gate interface, to drive the further voltage to equal the first reference voltage;
a first power amplifier (PA) interface configured to output a first control voltage in response to the first stabilized voltage, wherein the first control voltage provides a first bias voltage for a first radio frequency signal applied to an input of a first PA device; and
a first digital to analog converter (DAC) electrically coupled between the output of the first comparator circuit and the first PA interface that offsets the first stabilized voltage by a first offset voltage to produce the first control voltage.

22. A bias controller for a power amplifier, the bias controller comprising:
a first reference device source/drain interface;
a first reference device gate interface;
a first bias voltage generator that includes a first comparator circuit wherein a first input of the first comparator circuit is configured to receive a first reference voltage and a second input of the first comparator circuit is electrically coupled to the first reference device source/drain interface, and wherein an output of the first comparator circuit is coupled to the first reference device gate interface, wherein, during operation, the first comparator circuit is configured to compare the first reference voltage to a further voltage applied to the second input via the first reference device source/drain interface and to adjust an output voltage at the output of the first comparator circuit to attain a first stabilized voltage that induces a first reference device that is connected to the first reference gate interface, to drive the further voltage to equal the first reference voltage; and
a first power amplifier (PA) interface configured to output a first control voltage in response to the first stabilized voltage, wherein the first control voltage provides a first bias voltage for a first radio frequency signal applied to an input of a first PA device;
a second PA interface configured to output a second control voltage in response to the first stabilized voltage;
a first digital to analog converter (DAC) electrically coupled between the output of the first comparator circuit and the first PA interface that offsets the first stabilized voltage by a first offset voltage to produce the first control voltage; and a second DAC electrically coupled between the output of the first comparator circuit and the second PA interface that offsets the first stabilized voltage by a second offset voltage to produce the second control voltage.

23. A bias controller for a power amplifier, the bias controller comprising:

a first reference device source/drain interface;

a first reference device gate interface;

a first bias voltage generator that includes a first comparator circuit wherein a first input of the first comparator circuit is configured to receive a first reference voltage and a second input of the first comparator circuit is electrically coupled to the first reference device source/drain interface, and wherein an output of the first comparator circuit is coupled to the first reference device gate interface, wherein, during operation, the first comparator circuit is configured to compare the first reference voltage to a further voltage applied to the second input via the first reference device source/drain interface and to adjust an output voltage at the output of the first comparator circuit to attain a first stabilized voltage that induces a first reference device that is connected to the first reference gate interface, to drive the further voltage to equal the first reference voltage;

a first power amplifier (PA) interface configured to output a first control voltage in response to the first stabilized voltage, wherein the first control voltage provides a first bias voltage for a first radio frequency signal applied to an input of a first PA device;

a second PA interface configured to output a second control voltage in response to the first stabilized voltage;

a second reference device source/drain interface;

a second reference device gate interface;

a second bias voltage generator that includes a second comparator circuit wherein a first input of the second comparator circuit is configured to receive a second reference voltage and a second input of the second comparator circuit is electrically coupled to the second reference device source/drain interface, and wherein an output of the second comparator circuit is coupled to the second reference device gate interface, wherein, during operation, the second comparator circuit is configured to compare the second reference voltage to a further voltage applied to the second input via the second reference source/drain interface and to adjust an output voltage at the output of the second comparator circuit to attain a second stabilized voltage that induces a second reference device that is connected to the second reference gate interface, to drive the further voltage to equal the second reference voltage;

a third PA interface configured to output a third control voltage in response to the second stabilized voltage, wherein the third control voltage provides a third bias voltage for a third radio frequency signal applied to an input of a third PA device; and a fourth PA interface configured to output a fourth control voltage in response to the second stabilized voltage, wherein the fourth control voltage provides a fourth bias voltage for a fourth radio frequency signal applied to an input of a fourth PA device.

24. The bias controller of claim 23, further comprising:

a first digital to analog converter (DAC) electrically coupled between the output of the first comparator circuit and the first PA interface that offsets the first stabilized voltage by a first offset voltage to produce the first control voltage;

a second DAC electrically coupled between the output of the first comparator circuit and the second PA interface that offsets the first stabilized voltage by a second offset voltage to produce the second control voltage;

a third DAC electrically coupled between the output of the second comparator circuit and the third PA interface that offsets the second stabilized voltage by a third offset voltage to produce the third control voltage; and a fourth DAC electrically coupled between the output of the second comparator circuit and the fourth PA interface that offsets the second stabilized voltage by a fourth offset voltage to produce the fourth control voltage.

\* \* \* \* \*